LOW TEMPERATURE NEGATIVE RESISTANCE DEVICE

Filed Sept. 14, 1961

INVENTORS: D. KAHNG
G.E. SMITH
BY [signature]
ATTORNEY

United States Patent Office 3,121,808

Patented Feb. 18, 1964

3,121,808

LOW TEMPERATURE NEGATIVE RESISTANCE DEVICE

Dawon Kahng, Somerville, and George E. Smith, Berkeley Heights, N.J., assignors to Bell Telephone Laboratories, Incorporated, New York, N.Y., a corporation of New York Filed Sept. 14, 1961, Ser. No. 138,011
7 Claims. (Cl. 307—88.5)

This invention relates to semiconductor devices. More particularly, this invention relates to semiconductor PN junction diodes which exhibit a negative resistance portion in their output V-I characteristic at low temperatures.

Two-terminal negative resistance devices such as the tunnel diode and the PNPN diode presently are in commercial use in equipment such as amplifiers, relaxation oscillators and switches. However, most of these devices are difficult to fabricate and, as a result, expensive to use.

Accordingly, an object of this invention is a negative resistance device which is inexpensive to fabricate.

A feature of this invention is a negative resistance device including a single PN junction between two nondegenerate regions and a pair of degenerate surface portions to which electrodes are connected.

Another feature of this invention is provision for low temperature operation of the diode.

The invention is based on the discovery that an appropriately designed semiconductor device including a PN junction can exhibit a negative resistance characteristic when the ambient temperature is sufficiently low, typically relatively close to absolute zero.

In one specific embodiment of this invention a silicon wafer includes a pair of nondegenerate regions in which the predominant impurity concentration is less than $10^{19}$ atoms per cubic centimeter for forming a PN junction and each region is provided with a more heavily doped degenerate surface portion to which a separate electrode makes a low resistance ohmic connection. At a temperature of about four degrees Kelvin and at suitably high forward voltages this wafer exhibits a negative resistance V-I characteristic particularly useful, for example, as a surge protector for a maser which already requires operation at low temperatures.

Further objects and features will become apparent during the detailed discussion rendered in conjunction with the drawing, wherein.

It is to be understood that the figures are not necessarily to scale, certain dimensions being exaggerated for illustrative purposes.

Figure 1:
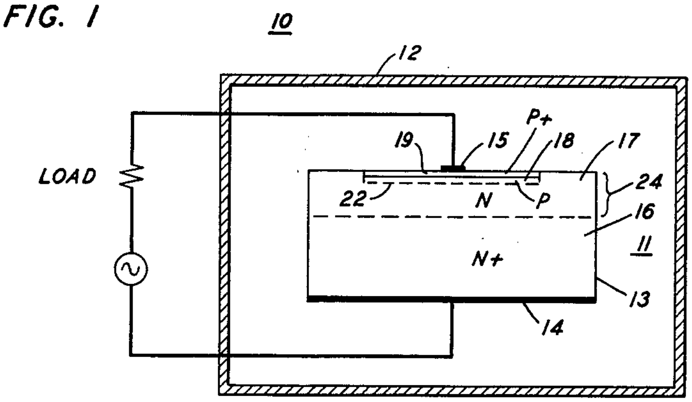
FIG. 1 illustrates partly in circuit schematic form and partly in cross section an arrangement in accordance with this invention.

With reference specifically to FIG. 1, the arrangement 10 comprises two elements: a semiconductor device 11 with its associated circuitry and a cooling means 12. The device 11 comprises a single crystal semiconductor wafer 13 and two electrodes 14 and 15. The semiconductor wafer includes four regions 16, 17, 18 and 19. Terminal regions 16 and 19 which the electrodes contact are degenerate regions of opposite conductivity type and serve to insure low resistance connections at the low temperatures contemplated. Intermediate regions 17 and 18 are nondegenerate regions also of opposite conductivity type and serve to define the PN junction 22. In this connection the term "degenerate" characterizes a region in which the Fermi level lies outside the forbidden energy gap and for silicon corresponds to an impurity concentration in excess of about $5 \times 10^{19}$ atoms per cubic centimeter. The term "nondegenerate" refers to a region in which the Fermi level lies within the forbidden energy gap and for silicon corresponds to impurity concentrations less than about $5 \times 10^{19}$ atoms per cubic centimeter. Cooling means 12 is an enclosure encompassing the device 11 for reducing the ambient temperature.

Advantageously, the wafer is of silicon and the degenerate region 16 is of N-type conductivity and includes for example about $10^{20}$ arsenic or antimony atoms per cubic centimeter, exhibiting a resistivity of about .01 ohm-centimeter. This region serves initially as the starting material and ultimately constitutes the bulk portion of the finished semiconductor. The region 17 is also of N-type conductivity. This region, however, is nondegenerate and has a resistivity in excess of .05 ohm-centimeter. A convenient method for providing this region is by well known epitaxial techniques in which case the region is a surface layer, typically .0005 inch deposited on the surface of the starting material. The term "epitaxial" characterizes a deposited single crystal layer having the same crystal orientation as the substrate crystal. Region 18 is of P-type conductivity and has a diameter advantageously less than the width of the starting material, for example .010 inch. The region makes intimate contact with region 17 for forming PN junction 22 therebetween. Conveniently, region 18 is provided by exposing a limited portion of the surface of the epitaxial surface layer to a low vapor pressure compound of a significant impurity of a suitable conductivity type for converting the conductivity type of the exposed portion of the layer. A suitable technique for accomplishing the desired conversion is disclosed in Patent 2,802,760 issued August 13, 1957, to L. Derick and C. J. Frosch in which an oxide mask is employed for defining the exposed surface area of the substrate for a subsequent diffusion step. A consequence of this exposure is a degenerate surface region 19 including a concentration of about $10^{20}$ atoms per cubic centimeter of the diffusant and a decreasing diffusant concentration with increasing penetration into the crystal. Typically, this concentration decreases to $10^{17}$ atoms per cubic centimeter at the plane of deepest penetration forming a configuration susceptible to description as two separate regions; to wit, a degenerate surface region and a nondegenerate underlayer.

Finally there are the separate electrodes 14 and 15 attached to the degenerate terminal regions 16 and 19 respectively. Although the electrodes may be formed by many known techniques, it may be desirable to form simultaneously the degenerate regions 16 and 19 and the electrodes 14 and 15. A convenient process in this connection is to provide an alloyed contact from a contact metal which includes a suitable impurity of like conductivity type to that of the underlying substrate. In this connection, a typical contact metal such as gold advantageously includes boron for providing substantially ohmic contacts to a P-type conductivity substrate. On the other hand, phosphorus and antimony are suitable impurities for insuring substantially ohmic connection to an N-type conductivity substrate. In the formation of such an alloyed contact, the impurity included initially in the contact metal diffuses into the semiconductor substrate at elevated temperatures to enrich the impurity concentration of a surface portion of the substrate to the degenerate level. Accordingly, the resulting structure is susceptible of being described as a four region lamellate device having degenerate surface regions of the opposite conductivity type serving as contact regions and a pair of intermediate regions of opposite conductivity type for defining a PN junction therebetween.

The cooling means 12 typically comprises an enclosure provided with a support for positioning the semiconductor within a suitable fluid. The liquid helium cryostat is particularly well adapted for this purpose. The cooling is important to insure that little current will pass until the forward bias voltage applied reaches the value at which the breakdown occurs. In particular, it is found advantageous to this end to operate at temperatures between 1.2 degrees Kelvin and 20 degrees Kelvin.

In one specific embodiment, the device 11 comprises a silicon semiconductor wafer 13, .050 x .050 x .010 inch, to which are connected the electrodes 20 and 21. The bulk portion 16 of the wafer 13 is degenerate N-type conductivity material having a resistivity of about .002 ohm-centimeter and including approximately $10^{20}$ arsenic atoms per cubic centimeter. The wafer also includes an epitaxial surface layer 24, .002 inch thick, deposited by the hydrogen reduction of silicon tetrachloride in a manner well known. A portion of layer 24 ultimately becomes the nondegenerate layer 17 which in this embodiment is of N-type conductivity and has a resistivity of .1 ohm-centimeter and a thickness of .00016 inch. Additionally, there is provided in a single diffusion step diffused P-type region 18 about .010 inch in diameter and .00004 inch deep on a small portion of the surface layer 24 and the P-type degenerate surface region 19. The PN junction 22 also is formed simultaneously between regions 18 and 17 thereby. The temperature of the device was maintained at the appropriate temperature for operation by positioning the device in a liquid helium cryostat.

This embodiment was constructed as follows. A single crystal silicon wafer approximately .100 x .100 x .005 inch and including $10^{20}$ atoms of arsenic per cubic centimeter (resistivity of .002 ohm-centimeter) was used as a starting material. The wafer was exposed to a vapor mixture of silicon tetrachloride and hydrogen, the silicon tetrachloride subsequently being reduced by the hydrogen by increasing the temperature of the vapor mixture to 1200 degrees centigrade for sixteen minutes for depositing an epitaxial film of single crystal silicon .0002 inch thick therefrom. Thereafter, the wafer was kept in steam at one atmosphere pressure and 150 degrees centigrade for fifteen minutes to produce an oxide coating 5,000 Angstrom units thick. Holes .010 inch in diameter were provided in the oxide film by known photo-resist techniques whereafter the wafer was exposed to a vapor of $B_2O_5$ at 950 degrees centigrade for fifteen minutes to diffuse boron through the holes in the oxide into the silicon surface to a depth of .00004 inch. Subsequently, gold was evaporated onto opposite surfaces of the wafer to provide ohmic contacts to the silicon over the entire back of the wafer and the front as exposed by the holes in the oxide. Finally, the wafer was divided into four .050 inch squares by ultrasonic cutting techniques. At room temperature the device exhibited good conductivity when biased in the forward direction, being substantially nonconducting only in the reverse direction until a reverse bias voltage of 2.5 volts was applied.

Under suitably low temperature conditions, and in response to an increasing forward bias voltage, the current in a load connected in series with the voltage source remains low until the breakdown voltage is reached. Thereafter the current increases while the voltage drop across the device decreases abruptly to the value corresponding to the energy gap of the semiconductor material. For further increases in forward bias voltage, the device exhibits a normal forward characteristic, current increasing rapidly with increasing voltage (limited only by the external load).

In the described embodiment, the width of the nondegenerate portion is about .00016 inch. This is approximately equal to the length of a mean free path of a charge carrier in the nondegenerate regions.

Figure 2:
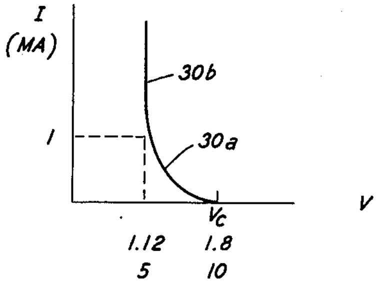
FIG. 2 is the output V-I characteristic of the arrangement of FIG. 1.

FIG. 2 shows the V-I characteristic exhibited by this embodiment when connected in series with the load resistance of 1000 ohms and a variable voltage supply. In response to an applied voltage, current remains substantially zero until a value of 1.8 volts is reached whereafter current increases to five milliamperes as applied voltage decreases to 1.12 volts. In response to increases in applied voltage from 1.12 volts, current increases rapidly. The reverse breakdown voltage of the device is increased from its room temperature value by about 1.4 volts at the low temperatures contemplated. The abrupt decrease in the voltage drop across the device is illustrated by portion 30*a* of the curve. The ultimate operation in the forward biased condition is illustrated by portion 30*b* of the curve.

The device exhibits a breakdown voltage greater than its room temperature value by an amount characteristics of the material and configuration employed.

For silicon devices including nondegenerate N-type conductivity regions of substantially greater thickness than a minority carrier diffusion length the characteristic is similar in shape. However, the voltage and current values differ from a device including a narrow nondegenerate region. For example, in a device including a nondegenerate region wider than a diffusion length, in response to an applied voltage, the current remained substantially zero until a value of ten volts was reached whereafter current increases to one milliampere as applied voltage decreases to five volts. In response to increases in applied voltage from five volts, current increased rapidly. The reverse breakdown voltage of the device was increased from its room temperature value of 40 volts to 55 volts.

Figure 3:
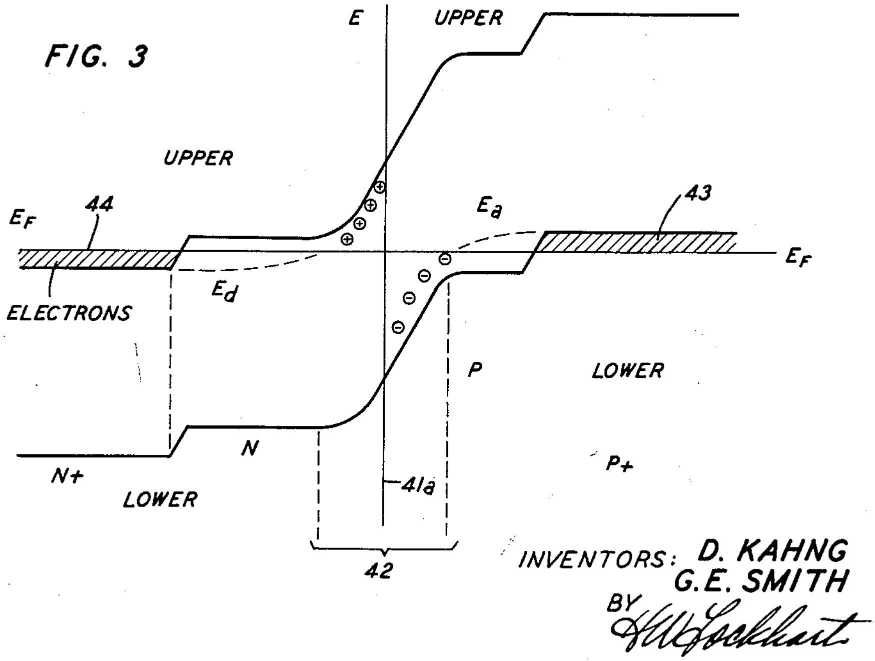
FIG. 3 is an energy diagram useful in explaining the behavior of the arrangement of FIG. 1.

The semiconductor of FIG. 1 is represented conveniently by the energy diagram of FIG. 3. The portion of the energy diagram of particular interest in operation is that which corresponds to the vicinity of the PN junction of FIG. 1. The expression "vicinity of the PN junction" includes the PN junction, the depletion region and the portions of the conductivity type regions bounding the depletion region. Specifically, line 41*a* represents the center of the charge carrier depletion region 42 associated with the PN junction. Accordingly, line 41*a* can be taken as representing the position of the PN junction. Line 41*a* also represents the energy axis in the energy diagram. The horizontal axis represents distance into the wafter from the PN junction.

Typically, an energy diagram is characterized by an upper and a lower band of energies separated by a forbidden energy gap characteristic of the particular material. For the case of silicon the energy gap is 1.12 electron volts.

The Fermi level $E_F$ designates the energy level at which the probability of a charge carrier occupying that level is .5. P-type impurities provide an energy level $E_a$ at just above the top of the lower band to the right of line 41*a*. In material having acceptors the Fermi level is found between the acceptor level and the middle of the forbidden gap at room temperature. As the temperature decreases, the probability of finding a charge in the acceptor level decreases. This can be expressed as the lowering in the position of the Fermi level to that shown in the figure. As shown in FIG. 3, the $P^+$ region corresponding to the (high impurity concentration) surface of the P region of FIG. 1 is represented to the right of the P region. The Fermi level shown above the top of the lower band in the P region is shown below the top of the lower band in the $P^+$ region. This means that even at the temperatures contemplated the probability of holes filling the levels above the Fermi level and below the top of the lower band in the $P^+$ region is unity and holes will appear in this area 43.

Similarly, to the left of line 41*a*, donor levels $E_d$ are provided by the N-type impurities and these levels appear just below the upper band. The corresponding position for the Fermi level is above the donor level but below the bottom of the upper band at the critical temperature or lower. However, if the N-type impurity concentration is excessive (N+) as in the surface of bulk portion 16 of the wafer 11 the Fermi level is found in the upper band and electrons are available as indicated by the area 44 between the Fermi level and the bottom of the upper band where the probability of there being a charge carrier for filling an available energy level is unity.

Accordingly, there are four distinct regions in the device of FIG. 1, the relatively low resistivity N+-type bulk region, the relatively high resistivity N-type epitaxially deposited surface region, the relatively high resistivity P-type interior portion of the diffused region 18 and the relatively low resistivity P+-type surface of the diffused region 18. The transitions between these regions are indicated by singularities in the boundaries of the forbidden gap. The extent of these singularities is illustrated by the distance (in energy) between the lines bounding the energy bands under the condition that the Fermi level be constant throughout the crystal under equilibrium conditions. The singularities correspond to relatively large changes in potential over very small distances.

In operation, the temperature of the device of FIG. 1 is lowered to a temperature where the semiconductor is effectively an insulator. For .1 ohm-centimeter N-type material including at room temperature $10^{16}$ atoms per cubic centimeter of ionized impurities (and so the same number of free electrons), the reduction in temperature to about four degrees Kelvin reduces the free electron concentration to $10^6$ per cubic centimeter, at which value the semiconductor has a resistance greater than $10^8$ ohms. Moreover, the energy diagram indicates that separate sources 43 and 44 exist for holes and electrons, respectively. However, these sources are remote from the PN junction. Accordingly, with the exception of the depletion region in the neighborhood of the PN junction and through the entire P and N region substantially no ionized impurities are found.

Any charge carriers (here electrons) introduced, as for example by photo-production of hole-electron pairs, simply recombine or disappear into the potential well of the PN junction. However, when the electric field $E_c$ (500-volt/centimeter for an arsenic doped silicon wafer), corresponding to the critical applied voltage $V_c$ prevails, any electrons present, for example, in the N-type conductivity region, are sufficiently accelerated thereby to produce impact ionization of filled donor states. Impact ionization is the ionization of an un-ionized impurity by impact with an energetic particle. The result is an avalanche increase in the number of charge carriers (electrons).

In the P and N-type conductivity regions a dynamic equilibrium is established between the electric field, the concentration of the donor impurities (un-ionized) and the concentration of charge carriers. Accordingly, there appear an increased number of electrons and holes on each side of the PN junction resulting in the normal PN junction behavior. Specificallly, minority carriers are injected across the PN junction. Thus in the N-type conductivity region the presence of minority carriers with a positive charge alters the dynamic equilibrium in such a way as to maintain the electron concentration with a reduced electric field. Maintenance of the electron concentration implies maintenance of the flow of current. However, the reduction in the electric field implies a drop in the terminal voltage, therefore a negative resistance is exhibited.

The theory of operation of the semiconductor in an arrangement in accordance with this invention, therefore, can be summarized as follows. At the low temperatures contemplated, where the impurities are un-ionized, no current can flow in response to increasing voltage because there is an insignificant number of charge carriers available in the crystal. When the applied voltage is increased sufficiently, formerly un-ionized impurities are impact ionized and large numbers of charge carriers become available for supporting a current flow. The mechanism at this point is entirely analogous to normal PN junction operation. Accordingly, minority carriers are injected across the junction and the applied voltage can be relaxed from the value needed to initiate the ionization while the current flow remains constant or increases slightly. Therefore, the device operates as a normal PN junction device coupled with a mechanism for controlling the normal PN junction operation.

As is stated above, the electrodes to the device desirably make low resistance ohmic connections at the temperature contemplated for operation in accordance with this invention. To insure that the connection is of low resistance at the temperatures required, it has been found advantageous to include higher impurity concentrations in the wafer portions contacted by the electrodes.

The above-described specific illustrative system is susceptible of numerous and varied modifications all clearly within the spirit and scope of this invention as will at once be apparent to those skilled in the art. No attempt has here been made to illustrate exhaustively all such possibilities. For example, a device in accordance with this invention including a nondegenerate conductivity type region having a thickness in excess of one or two minority carrier diffusion lengths clearly is susceptible to fabrication by diffusion techniques without the necessity of the epitaxial surface layer.

What is claimed is:

1. In combination, a semiconductor wafer including first and second regions of opposite conductivity type defining therebetween a PN junction, said first and second regions having separate degenerate surface portions, separate low resistance contacts to each surface portion, means connected to said low resistance contacts for forward biasing said junction at about a breakdown voltage, and means for maintaining said wafer at a temperature of less than about 20 degrees Kelvin at which the resistance of said wafer is high for values of forward bias below the breakdown voltage until the breakdown voltage is reached.

2. In combination, a semiconductor wafer including first and second regions of opposite conductivity type defining therebetween a PN junction, the sum of the thicknesses of said first and second regions being about a diffusion length of a minority charge carrier, said first and second regions including first and second degenerate surface portions, a low resistance contact to each of said degenerate surface portions, means connected between said low resistance contact for forward biasing said PN junction at about a breakdown voltage, and means for maintaining said wafer at a temperature of less than about 20 degrees Kelvin at which the resistance of said wafer is high for values of forward bias below the breakdown voltage until the breakdown voltage is reached.

3. In combination, a silicon semiconductor wafer including a first region of N-type conductivity and a second region of P-type conductivity defining therebetween a PN junction, said first and second regions having separate degenerate surface portions, separate low resistance contacts to each surface portion, means connected to said low resistance contacts for forward biasing said junction at about a breakdown voltage, and means for maintaining said wafer at a temperature of less than about 20 degrees Kelvin at which the resistance of said wafer is high for values of forward bias below the breakdown voltage until the breakdown voltage is reached.

4. A combination in accordance with claim 3 wherein said first region has a thickness of between one and two minority carrier diffusion lengths.

5. A combination in accordance with claim 3 wherein said first region has a thickness greater than two minority carrier diffusion lengths.

6. In combination, a single crystal silicon wafer comprising a bulk portion including an arsenic concentration of about $10^{20}$ atoms per cubic centimeter, and an epitaxially grown surface layer substantially of N-type conductivity, said surface layer having a thickness of about .0002 inch and including a diffused P-type conductivity surface portion approximately .00016 inch thick for forming a PN junction, a separate gold contact to said bulk portion and said P-type conductivity surface portion, means connected between said contacts for forward biasing said PN junction at about a breakdown voltage, and a liquid helium cryostat for maintaining the temperature of said wafer at about four degrees Kelvin.

7. In combination, a semiconductor wafer including a first region of a first conductivity type and a second region of the opposite conductivity type defining therebetween a PN junction, input and output means connected to opposite sides of said PN junction, means for forward biasing said PN junction at about a breakdown voltage, and means for maintaining the temperature of said wafer at less than about 20 degrees Kelvin at which the resistance of said wafer is high for values of forward bias below the breakdown voltage until the breakdown voltage is reached.

References Cited in the file of this patent

UNITED STATES PATENTS

| | | |
|---|---|---|
| 3,012,154 | Gold et al. | Dec. 5, 1961 |
| 3,064,132 | Strull | Nov. 13, 1962 |
| 3,067,485 | Ciccolella et al. | Dec. 11, 1962 |

OTHER REFERENCES

Radio-Electronic Engineering, by James Kauke, April 1953, page 10.